United States Patent
Sullivan

[11] Patent Number: 5,920,452
[45] Date of Patent: Jul. 6, 1999

[54] CIRCUIT AND METHOD FOR PROTECTING FROM OVERCURRENT CONDITIONS AND DETECTING AN OPEN ELECTRICAL LOAD

[75] Inventor: Richard G. Sullivan, Lake Orion, Mich.

[73] Assignee: Harris Corporation, Palm Bay, Fla.

[21] Appl. No.: 09/088,198

[22] Filed: Jun. 1, 1998

[51] Int. Cl.[6] .................................................. H02H 3/00
[52] U.S. Cl. ............................................. 361/101; 361/87
[58] Field of Search ................................. 361/86, 87, 93, 361/100, 101

[56] References Cited

U.S. PATENT DOCUMENTS

| | | | |
|---|---|---|---|
| 3,749,936 | 7/1973 | Bell | 361/93 |
| 4,612,638 | 9/1986 | Kissel | 395/183.01 |
| 4,740,723 | 4/1988 | Sugayama et al. | 327/440 |
| 4,931,778 | 6/1990 | Guajardo | 340/664 |
| 4,945,445 | 7/1990 | Schmerda et al. | 361/101 |
| 5,091,664 | 2/1992 | Furuhata | 327/574 |
| 5,119,312 | 6/1992 | Groger et al. | 361/93 |
| 5,272,392 | 12/1993 | Wong et al. | 327/109 |
| 5,304,935 | 4/1994 | Rathke et al. | 324/415 |
| 5,375,029 | 12/1994 | Fukunaga et al. | 361/101 |
| 5,412,255 | 5/1995 | Wallrafen | 307/116 |
| 5,510,950 | 4/1996 | Bills et al. | 361/93 |
| 5,563,759 | 10/1996 | Nadd | 361/101 |
| 5,636,097 | 6/1997 | Palara et al. | 361/101 |
| 5,672,917 | 9/1997 | Nakano | 307/116 |
| 5,694,282 | 12/1997 | Yockey | 361/86 |

*Primary Examiner*—Jeffrey Gaffin
*Assistant Examiner*—Michael J. Sherry
*Attorney, Agent, or Firm*—Allen, Dyer, Doppelt, Milbrath & Gilchrist, P.A.

[57] ABSTRACT

A circuit protects from overcurrent conditions and detects an open electrical load. A microprocessor has at least one microprocessor terminal that is configurable as an output for generating a command signal to an electrical load and as an input for monitoring the condition of the electrical load. A first transistor is operatively connected to the microprocessor terminal and has an output to be connected to the electrical load. The first transistor has ON and OFF states. A second transistor is powered from a power supply and is connected to the first transistor and the microprocessor terminal. The second transistor is operative to generate an output logic signal back to the microprocessor and to latch the first transistor into one of either ON or OFF states under normal load conditions responsive to the receipt of a command signal from the microprocessor, and to maintain the first transistor in an OFF state upon an abnormal overcurrent condition through the first transistor. The second transistor is also operative to maintain an open load logic signal to the microprocessor after repeated attempts to switch the first transistor into an OFF state.

36 Claims, 2 Drawing Sheets

CIRCUIT AND METHOD FOR PROTECTING FROM OVERCURRENT CONDITIONS AND DETECTING AN OPEN ELECTRICAL LOAD

FIELD OF THE INVENTION

This invention relates to a circuit and method for controlling and monitoring an electrical load, and more particularly, to a circuit and method that protects an output device from overcurrent conditions and detects an open load.

BACKGROUND OF THE INVENTION

In an automobile circuit and other similar applications, a circuit interfaces with a microprocessor and not only controls a load, such as for turning the load off and on, but also monitors the condition of the load. For example, a microprocessor can generate a command signal to a circuit for turning on a lamp. Additionally, the circuit can monitor the lamp to determine when a short occurs or when the lamp (e.g., the load) is not present. These circuits are known in the prior art and typically include a power transistor for connecting and disconnecting the load with a source of voltage. The circuits also include monitoring circuitry for sensing the circuit conditions. Some of these circuits use a microprocessor having separate input and output pins on the microprocessor chip. One pin can be used for controlling the load and the other pin can be used for monitoring the load.

The circuit disclosed in U.S. Pat. No. 5,510,950 to Bills, et al. discloses a circuit where not only the condition of a load can be controlled, but also the load can be monitored from a single controller input/output pin. The disclosed circuit uses a field effect transistor that works with the microprocessor. However, this circuit is somewhat complicated and allows a small percentage of the full voltage to be used, such as for lighting a lamp, in order to give the lamp time for its filament to warm. Thus, when a filament is warming in the lamp, the high resistance would appear as a short. This circuit provides a solution for this problem by sending a small voltage. Additionally, this circuit is used on the high side of the automotive circuit, i.e., connected directly to the battery to obtain the 12 volts. The use of a high side circuit requires more complicated circuits, as compared to a low side where a switch or other circuit would be connected to the ground and then to a switch.

Another circuit disclosed in U.S. Pat. No. 5,694,282 to Yockey is designed as a low side circuit, and uses a microprocessor with its terminal alternatively configurable as an input and an output. When the terminal is configured as an output, the microprocessor can turn the electrical load on and off via the transistor under software control. When the microprocessor load turns on, the microprocessor reconfigures the terminal as an input. The system then latches the electrical load on until a short circuit occurs or until the microprocessor turns the load off. When a short circuit occurs, the system automatically turns the load off, and the microprocessor terminal is configured as an input to detect the off load.

One of the drawbacks of this circuit is that it cannot determine if an open load exists. This circuit does protect the transistor in case there is a short circuit, but it does not monitor in case there is an open load.

SUMMARY OF THE INVENTION

It is therefore an object of the present invention to provide a simple circuit that can be used on the low side of an automobile battery system to protect from overcurrent conditions and detect an open electrical load.

In accordance with the present invention, the present circuit can be used with a low side automobile application and is simplified because it only uses a first and second transistor and a microprocessor having at least one microprocessor terminal configurable as an output for generating a command signal to an electrical load and as an input for monitoring the condition of the electrical load. The second transistor is operative to latch the first transistor into one of either ON or OFF states under normal load conditions responsive to the receipt of a command signal from the microprocessor and to maintain the first transistor in an OFF state upon an abnormal overcurrent condition through the first transistor. The circuit also maintains a logic signal to the microprocessor after repeated attempts to switch the first transistor into an OFF state.

The circuit of the present invention now protects from overcurrent conditions and detects an open electrical load. A microprocessor has at least one microprocessor terminal configurable as an output for generating a command signal to an electrical load and as an input for monitoring the condition of the electrical load. A first transistor is operatively connected to the microprocessor terminal and has an output to be connected to the electrical load. The first transistor has ON and OFF states. The second transistor is connected to the first transistor and the microprocessor terminal. The second transistor is operative to generate an output logic signal back to he microprocessor and to the first transistor to switch the first transistor into an ON state. The second transistor is operative to latch the first transistor into one of either ON or OFF states under normal load conditions responsive to the receipt of a command signal from the microprocessor and to maintain the first transistor in an OFF state upon an abnormal overcurrent condition to the first transistor, and to maintain a logic signal to the microprocessor after repeated attempts to switch the first transistor into an OFF state under an open load condition.

Means operatively connects the second transistor with the output of the first transistor and can comprise a diode and resistor connected in series.

In still another aspect of the present invention, the second transistor comprises an NPN bipolar transistor having a base, emitter and collector. The transistor power supply is connected to the collector of the NPN transistor and the collector is operatively connected to the second transistor. The output of the first transistor is preferably connected to the base of the second transistor.

In still another aspect of the present invention, the second transistor provides a "high" logic signal corresponding to the voltage of a microprocessor power supply back to the microprocessor after repeated attempts to switch the first transistor into an OFF state. First and second transistors are also preferably connected to ground. The microprocessor power supply also comprises preferably a positive five volt power supply and the first transistor comprises a field effect transistor.

A method aspect of the invention is also disclosed for protecting a circuit from overcurrent conditions and detecting an open electrical load. The method comprises the steps of providing a microprocessor having at least one microprocessor terminal configurable as an output for generating a command signal to an electrical load and as an input for monitoring the condition of the electrical load.

The method also comprises the step of connecting a first transistor to the microprocessor terminal wherein the first transistor has an output to be connected to an electrical load and ON or OFF states. The method also comprises connecting a second transistor to the first transistor in the microprocessor terminal, generating an output logic signal and a second transistor back to the microprocessor and to the first transistor to switch the first transistor into an ON state. The method further comprises the step of latching the first transistor into one of either ON or OFF states under normal load conditions responsive to the receipt of a command signal from the microprocessor and under abnormal load conditions, and maintaining the first transistor in an OFF state upon an overcurrent condition to the first transistor. The logic signal is maintained to the microprocessor after repeated attempts to switch the first transistor into an OFF state based upon an open electrical load condition.

The method also comprises the step of operatively connecting a microprocessor power supply to the microprocessor terminal to provide a voltage to the second transistor. The microprocessor power supply is preferably operatively connected to the microprocessor terminal to provide a voltage corresponding to a logic signal to the microprocessor indicative of no load. The method also comprises the step of operatively connecting the second transistor to the output of the first transistor to monitor the output of the first transistor. The method also comprises the step of connecting the second transistor with the output of the first transistor with a diode and resistor in series. The method also comprises the step of forming the second transistor as a bipolar transistor having a base, emitter and collector.

In still another aspect of the present invention, the method comprises the step of connecting the transistor power supply to the collector of the bipolar transistor and the second transistor. The method also comprises the step of connecting the first transistor to the base of the second transistor. The transistor power supply can preferably be supplied at the positive five volt power supply and the first and second transistors can be connected to ground.

In still a further aspect of the invention, the method comprises the step of providing a "high" logic signal corresponding to the voltage of the transistor power supply back to the microprocessor after repeated attempts to switch the first transistor into an OFF state, indicative of an open load.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous because it provides a simplified circuit for use in a low side automobile application that protects from overcurrent conditions, such as short circuits, and open loads, and uses one pin of a microprocessor as both an input and an output. The circuit is also self-latching and holds the circuit in its proper position. The microprocessor, in the meantime, has been free to accomplish other tasks. Additionally, in those instances when the circuit would apparently detect what appears to be a shorted condition, such as when a lamp is first turned on, the circuit monitors the lamp or other load, even though the circuit monitoring function may initially indicate a short circuit condition. A technique will be described to overcome this problem.

The present circuit can also be formed as a monolithic device, which is self-latching and protective of feedback. As a monolithic device, the circuit can be formed with other transistors in the polystructure of an FET or MOSFET manufacturing process.

The circuit is simplified because it can be preferably used on a low side automotive circuit (i.e., connected to the ground) instead of the high side (i.e., connected directly to the battery or fuse). As a result, the circuit does not require a P-channel FET and PNP transistor to bring the circuit to the positive side of the battery. It also does not require discrete circuitry to buffer the high side switch and microprocessor. Because connection is to the low side, a NPN transistor can be used in a simplified circuit.

Figure 1:
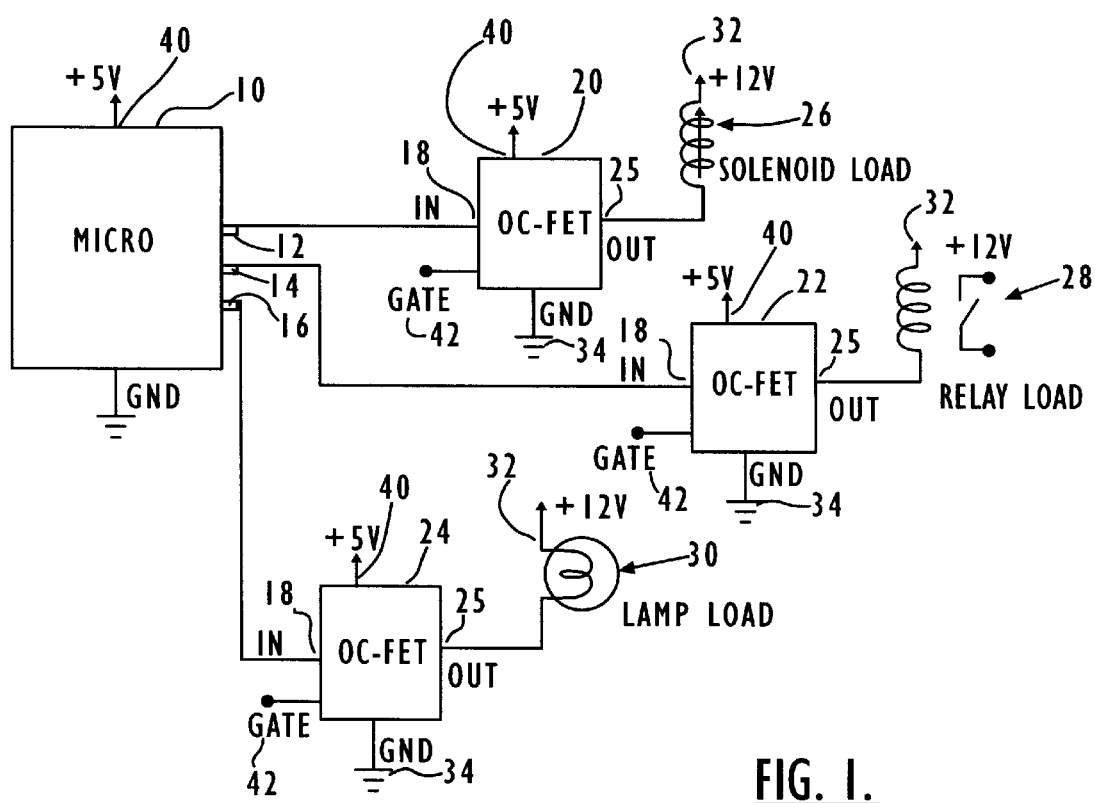
FIG. 1 is a high level schematic/block diagram that shows a microprocessor connected to three different overcurrent field effect transistor circuits of the present invention that control respective solenoid, relay and lamp loads in an automobile.

Referring now to FIG. 1, there is illustrated a microprocessor 10 that includes three input/output (I/O) ports 12, 14, 16 that are formed as pins in the microprocessor, and respectively connected to the IN terminals 18 (pins) of overcurrent Field Effect Transistor (FET) circuits of the present invention, indicated generally at 20, 22 and 24, and labeled as OC-FET. The overcurrent circuits connect via respective OUT terminals 25 (pins) into a solenoid load 26, relay load 28 and lamp load 30 that are part of the automobile circuit, as indicated by those circuits connected directly to the positive 12 volt supply 32 of the battery, and also connected to ground 34 typically via a pin. Not only do each of the overcurrent circuits connect to the ground 34, but they also include a microprocessor power supply formed as a +5 volt source 40. A gate connection 42, such as a pin is also illustrated. The overcurrent circuits of the present invention could be used in an automotive electronic control module and, naturally, it is anticipated that various overcurrent circuits using the field effect transistor of the present invention as described later will be available in different current ratings.

Figure 2:
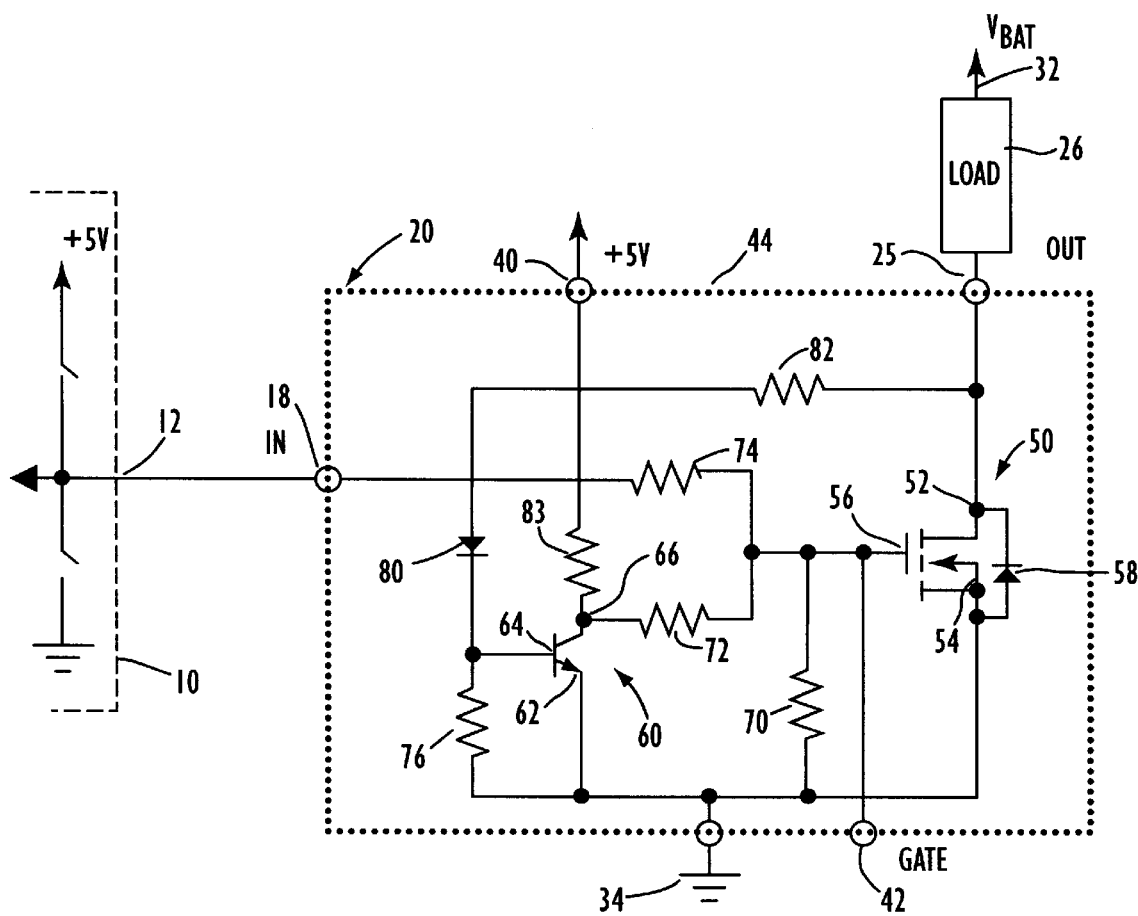
FIG. 2 is an electrical schematic diagram of the overcurrent circuit in accordance with one aspect of the present invention.

Referring now to FIG. 2, an example of the overcurrent protection circuit of the present invention is illustrated as the portion of the circuit contained within the dotted lines 44. For purposes of clarity, the description will proceed relative to the overcurrent field effect transistor circuit 20 used with the solenoid load 26. A typical microprocessor I/O port 12 is also shown, as well as the representative load 26 and appropriate voltage sources. The device can be built on a single piece of silicon such as a Harris RLP1N06CLE intelligent discrete device manufactured by Harris Corporation. It could be mounted in a standard five lead TO-220 style (or variant) package designed and manufactured by Harris Corporation.

As illustrated in FIG. 2, the microprocessor includes an input/output port (or terminal) 12 that also connects to a +5 volt supply corresponding to the microprocessor power supply. The microprocessor has its microprocessor terminal 12 configurable as an output for generating a command signal to an electrical load such as the solenoid load 26, and configurable as an input for monitoring the condition of the electrical load 26. A first transistor 50 is formed as a field effect transistor and operatively connected to the microprocessor terminal and has an output to be connected to the electrical load. This first transistor has ON and OFF states. The field effect transistor 50 includes a drain 52, source 54 and gate 56. The drain 52 is connected to the load 26 as illustrated to form the output of the field effect transistor. The source 54 is connected to the ground and a parasitic diode 58 is inherent between the drain and source of the field effect transistor. The gate 56 has a gate terminal 42 as illustrated.

A second transistor 60 is formed as a bipolar NPN transistor and includes an emitter 62, base 64 and collector 66. The collector 66 is connected to the power supply 40 of five volts that provides the source of transistor voltage via a pin. The emitter is connected to ground 34. The collector 66 is also connected to the gate 56 of the field effect transistor, and the circuit is also connected to the In terminal 18.

Appropriate resistors 70,72,74,76 and 83 are connected in the circuit as illustrated.

The second transistor 60 is operative to generate an output logic signal back to the microprocessor 10. The second transistor 60 is also operative to latch the first transistor into one of either ON or OFF states under normal load conditions responsive to the receipt of a command signal from the microprocessor and to maintain the first transistor in an OFF state upon an abnormal overcurrent condition through the first transistor, and to maintain the logic signal to the microprocessor after repeated attempts to switch the first transistor into an OFF state, indicative of an open load.

As illustrated, the +5 volts is supplied to the microprocessor terminal to provide a voltage corresponding to a logic signal indicative of an open electrical load. The connection between the base 64 and the output of the field effect transistor via the drain 52 includes a diode 80 and resistor 82 to allow monitoring of the output of the field effect transistor. This second transistor, formed as the NPN bipolar transistor, also provides a "high" logic signal corresponding to the +5 volts of the power supply 40 back to the microprocessor after repeated attempts to switch the first transistor into an OFF state. For purposes of clarity, the circuit operation will now be described in detail with particular reference to FIG. 2.

In operation, the circuit not only provides a self-latching function, but also provides for overcurrent protection for short circuits and indications for both an open load condition and an overcurrent condition. In the following description, the overcurrent protection circuit 20 will be referred to as the OC-FET.

In a first operational condition, corresponding to a normal operation, voltage sources are assumed stable, and the load 26 is assumed to be normal (no faults). The load 26 is in the OFF state. The microprocessor 10 will configure its I/O port 12 as an output and send a positive pulse to the "IN" pin 18 of the OC-FET 20. This signal is sufficient to turn ON the output, the first transistor, i.e., Field Effect Transistor 50. The drain of the first transistor will go to a voltage close to ground determined by the resistance of the transistor 50 and the load current. Typically, the designer will set this to be below 0.7 volts under worst case conditions. This low voltage will, in turn, be interpreted as an OFF command to the NPN second transistor 60 of the OC-FET 20.

Because the second transistor 60 is OFF, the "+5V" pin of the OC-FET 20 will drive the first transistor 50 directly and latch that first transistor ON. Once this happens, the signal from the microprocessor 10 is no longer needed to maintain the OC-FET 20 in the ON state and the microprocessor is free to do other processing chores. If this I/O port 12 is now configured as an input, the voltage on it will be at a logic "one" and indicate the OC-FET 20 is still turned ON. To turn the OC-FET 20 OFF, the microprocessor 10 configures the I/O port 12 as an output and sends a negative pulse to the "IN" pin 18 of the OC-FET 20. This causes the second transistor 50 to turn OFF, which in turn causes the drain voltage to approach the V(bat) supply voltage. When this occurs, the second transistor 60 is biased ON, and the collector 66 switches close to ground, causing the first transistor 50 to latch OFF. The signal from the microprocessor 10 is no longer needed. The microprocessor 10 monitors the voltage on the "IN" pin 18 of the OC-FET 20 and indicates the device is OFF by reporting a logic "zero" on this pin.

In a second operational condition, corresponding to an abnormal operation, if for some reason the LOAD 26 is not present, there will be no voltage source to turn "on" the second transistor 60. The "IN" pin 18 of the OC-FET 20 will always report a logic "one" to the microprocessor 10 when queried, even after repeated negative pulses to turn it OFF. This will indicate to the microprocessor 10 that the device has an open load. The first transistor 50 will be biased ON. Because there is no load, this causes no harm to the OC-FET 20. It should be noted that if the LOAD is shorted to ground (on the "OUT" pin 25 of the OC-FET 20), the same error message is received by the microprocessor 44. Again, this causes no damage to the OC-FET 20 because the LOAD current is effectively bypassing the device. It is left to the designer to determine if the error reported means OPEN LOAD or LOAD SHORT TO GROUND. In one case, the load is always OFF; in the other, the load is always ON.

In a third operational condition corresponding to an abnormal operation, if for some reason the load is shorted (the "OUT" pin 25 is connected directly to V(bat) on FIG. 2), an immediate high voltage will be provided to the second transistor 60, turning it ON. This will cause the first transistor 50 to turn OFF, thus protecting it from overcurrent. Sometimes, this "short" is a partial "short," and the OC-FET 20 will be protected when the voltage on the drain 52 of the first transistor 50 reaches the "turn on" voltage of the second transistor 60. In this particular illustrated circuit design, one diode 80 drop plus the V(BE) of the second transistor 60 as this voltage (about 1.5V). This voltage can be changed by adding additional diodes in series with diode 80 to meet the requirements of a customer design without substantially affecting the operation of the OC-FET 20.

In a fourth operational condition corresponding to a normal load, such as a lamp load 30, the in rush current is usually sufficient to trip the second transistor 60 into conduction and thus keep the lamp OFF. The designer could force the output pulse from the microprocessor to stay ON longer than this anticipated in rush current duration, but this would subject the device to a potential failure mode should an actual short of the load 30 be present. A better solution is to pulse the device ON multiple times in rapid succession, longer than the in rush current should take, and then "read" the IN pin 18 for its logic state. If it was a good lamp, the filament would warm up and the OC-FET would report it is ON. If it was truly a short, the device would report it was OFF. Multiple attempts to turn the lamp on could be made before concluding the device is in a shorted state.

In a normal power on cycle during power on, the OC-FET 20 could come up in either an OFF or ON state. To overcome this, it is suggested the microprocessor's I/O port be programmed to power up as an output, and a logic "zero" be programmed on this pin. This will insure that the OC-FET is OFF.

To control the rise and fall time of the first transistor, an external resistor can be connected in parallel with resistor 74 (between the "IN" 18 and "GATE" 42 pins). It is anticipated that the typical relay, solenoid or lamp load will not require an external resistor because these loads do not require fast switching times, and thus radiated and conducted EMI is minimized.

It is evident that the overcurrent field effect transistor circuit of the present invention is advantageous over other prior art circuits because it not only allows for a low side circuit that is simple, but also allows for open load and short detection. The circuit can be produced on one chip.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A circuit for protecting from overcurrent conditions and for detecting an open electrical load comprising:
    a microprocessor having a microprocessor terminal configurable as an output for generating a command signal to an electrical load and an input for monitoring the condition of the electrical load;
    a first transistor operatively connected to said microprocessor terminal and having an output to be connected to the electrical load, said first transistor having ON and OFF states;
    a second transistor connected to said first transistor and said microprocessor terminal;
    wherein said second transistor is operative to latch the first transistor into one of either ON or OFF states under normal load conditions responsive to the receipt of a command signal from the microprocessor and to maintain the first transistor in an OFF state upon an abnormal overcurrent condition through the first transistor and to maintain a logic signal to said microprocessor after repeated attempts to switch the first transistor into an OFF state, indicative of an open load condition.

2. A circuit according to claim 1 and further comprising means operatively connecting the second transistor with the output of the first transistor to allow monitoring of the output of the first transistor.

3. A circuit according to claim 2 wherein said means operatively connecting the second transistor with the output of the first transistor comprises a diode and resistor connected in series.

4. A circuit according to claim 1 wherein said second transistor comprises an NPN bipolar transistor having a gate, emitter and collector.

5. A circuit according to claim 4 wherein the output of said first transistor is operatively connected to said base of said second transistor.

6. A circuit according to claim 1 and further comprising a microprocessor power supply, and wherein said second transistor provides a "high" logic signal corresponding to the voltage of the microprocessor power supply back to said microprocessor after repeated attempts to switch the first transistor into an OFF state, indicative of an open electrical load.

7. A circuit according to claim 6 wherein said collector of said second transistor is connected to the microprocessor power supply.

8. A circuit according to claim 1 wherein said first and second transistors are connected to ground.

9. A circuit according to claim 1 wherein said first transistor comprises a field effect transistor.

10. A circuit for protecting from overcurrent conditions and for detecting an open electrical load comprising:
    a microprocessor having a microprocessor terminal configurable as an output for generating a command signal to an electrical load and an input for monitoring the condition of the electrical load;
    a field effect transistor operatively connected to said microprocessor terminal and having an output to be connected to an electrical load, said field effect transistor having ON and OFF states;
    a bipolar transistor connected to said field effect transistor and said microprocessor terminal;
    wherein said bipolar transistor is operative to latch the field effect transistor into one of either ON or OFF states under normal load conditions responsive to the receipt of a command signal from the microprocessor and to maintain the field effect transistor in an OFF state upon an abnormal overcurrent condition through the field effect transistor and to maintain a logic signal to said microprocessor after repeated attempts to switch the field effect transistor into an OFF state.

11. A circuit according to claim 10 including a microprocessor power supply operatively connected to said microprocessor terminal to provide a voltage corresponding to a logic signal indicative of an open electrical load.

12. A circuit according to claim 10 wherein said bipolar transistor includes a base, and further comprising means operatively connecting the base of the bipolar transistor with the output of the field effect transistor to allow monitoring of the output of the field effect transistor.

13. A circuit according to claim 12 wherein said means operatively connecting the base of the bipolar transistor with the output of the field effect transistor comprises a diode and resistor connected in series.

14. A circuit according to claim 11 wherein said bipolar transistor provides a "high" logic signal corresponding to the voltage of the microprocessor power supply back to said microprocessor after repeated attempts to switch the field effect transistor into an OFF state.

15. A circuit according to claim 10 wherein said bipolar transistor and field effect transistor are connected to ground.

16. A circuit according to claim 11 wherein said second transistor includes a collector connected to the microprocessor power supply.

17. A circuit for protecting from overcurrent conditions and for detecting an open electrical load comprising:
    an output/input terminal through which a command signal to an electrical load is passed and an input is received for monitoring the condition of the electrical load;
    a first transistor operatively connected to the input/output terminal and having an output to be connected to an electrical load, said first transistor having ON and OFF states;
    a second transistor connected to said first transistor, a microprocessor power supply and said input/output terminal, wherein said second transistor is operative to generate an output logic signal back to said input/output terminal;

wherein said second transistor is operative to latch the first transistor into one of either ON or OFF states under normal load conditions responsive to the receipt of a command signal generated through said input/output terminal and to maintain the first transistor in an OFF state upon an abnormal overcurrent condition through the first transistor and to maintain a logic signal after repeated attempts to switch the first transistor into an OFF state, indicative of an open load condition.

18. A circuit according to claim 17 and further comprising means operatively connecting the second transistor with the output of the first transistor to allow monitoring of the output of the first transistor.

19. A circuit according to claim 18 wherein said means operatively connecting the second transistor with the output of the first transistor comprises a diode and resistor connected in series.

20. A circuit according to claim 17 wherein said second transistor comprises a bipolar transistor having a base, emitter and collector.

21. A circuit according to claim 20 including a microprocessor power supply connected to the collector of said bipolar transistor, wherein said collector is operatively connected to said first transistor.

22. A circuit according to claim 21 wherein said second transistor provides a "high" logic signal corresponding to the voltage of the microprocessor power supply back to said input/output terminal after repeated attempts to switch the first transistor into an OFF state, indicative of an open electrical load.

23. A circuit according to claim 20 wherein said first transistor is operatively connected to said base of said second transistor.

24. A circuit according to claim 17 wherein said first and second transistors are connected to ground.

25. A circuit according to claim 21 wherein said microprocessor power supply comprises a positive five volt power supply.

26. A circuit according to claim 17 wherein said first transistor comprises a field effect transistor.

27. A method for protecting a circuit from overcurrent conditions and for detecting an open electrical load comprising the steps of:

providing a microprocessor having a microprocessor terminal configurable as an output for generating a command signal to an electrical load and as an input for monitoring the condition of the electrical load;

connecting a first transistor to the microprocessor terminal wherein the first transistor has an output to be connected to an electrical load and ON and OFF states;

connecting a second transistor to the first transistor and the microprocessor terminal;

generating an output logic signal from the second transistor back to the microprocessor and to the first transistor to latch the first transistor into one of either ON or OFF states under normal load conditions responsive to the receipt of a command signal from the microprocessor, and under abnormal load conditions, maintaining the first transistor in an OFF state upon an overcurrent condition through the first transistor, and maintaining a logic signal to the microprocessor after repeated attempts to switch the first transistor into an OFF state based on an open electrical load condition.

28. A method according to claim 27 and further comprising the step of operatively connecting a microprocessor power supply to the microprocessor terminal to provide a voltage corresponding to a logic signal to the microprocessor indicative of no load.

29. A method according to claim 27 and further comprising the step of operatively connecting the second transistor to the output of the first transistor to monitor of the output of the first transistor.

30. A method according to claim 29 and further comprising the step of connecting the second transistor with the output of the first transistor with a diode and resistor in series.

31. A method according to claim 27 and further comprising the step of forming the second transistor as a bipolar transistor having a base, emitter and collector.

32. A method according to claim 31 and further comprising the step of connecting a microprocessor power supply to the collector of the bipolar transistor and the first transistor.

33. A method according to claim 31 and further comprising the step of connecting the first transistor to the base of the second transistor.

34. A method according to claim 27 and further comprising the step of providing a "high" logic signal corresponding to the voltage of a microprocessor power supply back to said microprocessor after repeated attempts to switch the first transistor into an OFF state, indicative of an open load.

35. A method according to claim 27 and further comprising the step of connecting the first and second transistors to ground.

36. A method according to claim 27 and comprising the step of providing a microprocessor power supply as a positive five volt power supply.

* * * * *